(12) United States Patent
Fukuda

(10) Patent No.: US 9,794,468 B2
(45) Date of Patent: Oct. 17, 2017

(54) IMAGE SENSOR, IMAGE CAPTURING APPARATUS, FOCUS DETECTION APPARATUS, IMAGE PROCESSING APPARATUS, AND CONTROL METHOD OF IMAGE CAPTURING APPARATUS USING PUPIL DIVISION IN DIFFERENT DIRECTIONS

(71) Applicant: CANON KABUSHIKI KAISHA, Tokyo (JP)

(72) Inventor: Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/955,929

(22) Filed: Dec. 1, 2015

(65) Prior Publication Data

US 2016/0156867 A1 Jun. 2, 2016

(30) Foreign Application Priority Data

Dec. 2, 2014 (JP) ................................. 2014-244382
Sep. 15, 2015 (JP) ................................. 2015-182231

(51) Int. Cl.
*H04N 5/232* (2006.01)
*H04N 5/369* (2011.01)

(52) U.S. Cl.
CPC ..... *H04N 5/23212* (2013.01); *H04N 5/23245* (2013.01); *H04N 5/3696* (2013.01)

(58) Field of Classification Search
None
See application file for complete search history.

(56) References Cited

U.S. PATENT DOCUMENTS

| 5,160,834 A | * | 11/1992 | Moriyama | ............. | G02B 7/346 |
| | | | | | 250/201.8 |
| 9,247,122 B2 | * | 1/2016 | Ichimiya | ................ | G02B 7/346 |
| 2002/0136550 A1 | * | 9/2002 | Kuwata | .................... | G02B 7/36 |
| | | | | | 396/114 |
| 2010/0073527 A1 | * | 3/2010 | Ichimiya | ................ | H04N 5/367 |
| | | | | | 348/247 |
| 2011/0109776 A1 | * | 5/2011 | Kawai | ............... | H01L 27/14625 |
| | | | | | 348/273 |

(Continued)

FOREIGN PATENT DOCUMENTS

JP 58-024105 A 2/1983
JP 2001-083407 A 3/2001

*Primary Examiner* — Shahbaz Nazrul
(74) *Attorney, Agent, or Firm* — Cowan, Liebowitz & Latman, P.C.

(57) ABSTRACT

An image sensor in which pixels, each having a photoelectric conversion region divided into a plurality of regions, are arranged two-dimensionally, the image sensor comprising: a first pixel, from the pixels, for which each of photoelectric conversion regions divided in a first direction receives a light beam that passes through a pupil region; and a second pixel, from the pixels, for which each of photoelectric conversion regions divided in a second direction different to the first direction receives a light beam that passes through the pupil region; wherein the first pixel outputs signals having parallax in the first direction from the photoelectric conversion regions divided in the first direction, and the second pixel outputs signals having parallax in the second direction from the photoelectric conversion regions divided in the second direction.

14 Claims, 9 Drawing Sheets

(56) References Cited

U.S. PATENT DOCUMENTS

| 2011/0310280 | A1* | 12/2011 | Goto | G02B 7/34 |
| | | | | 348/302 |
| 2014/0146197 | A1* | 5/2014 | Okuzawa | H04N 5/23212 |
| | | | | 348/222.1 |
| 2014/0204251 | A1* | 7/2014 | Ishida | H04N 5/23212 |
| | | | | 348/294 |

* cited by examiner

PLAN VIEW a-a CROSS-SECTIONAL VIEW

FIG. 4
FIG. 5
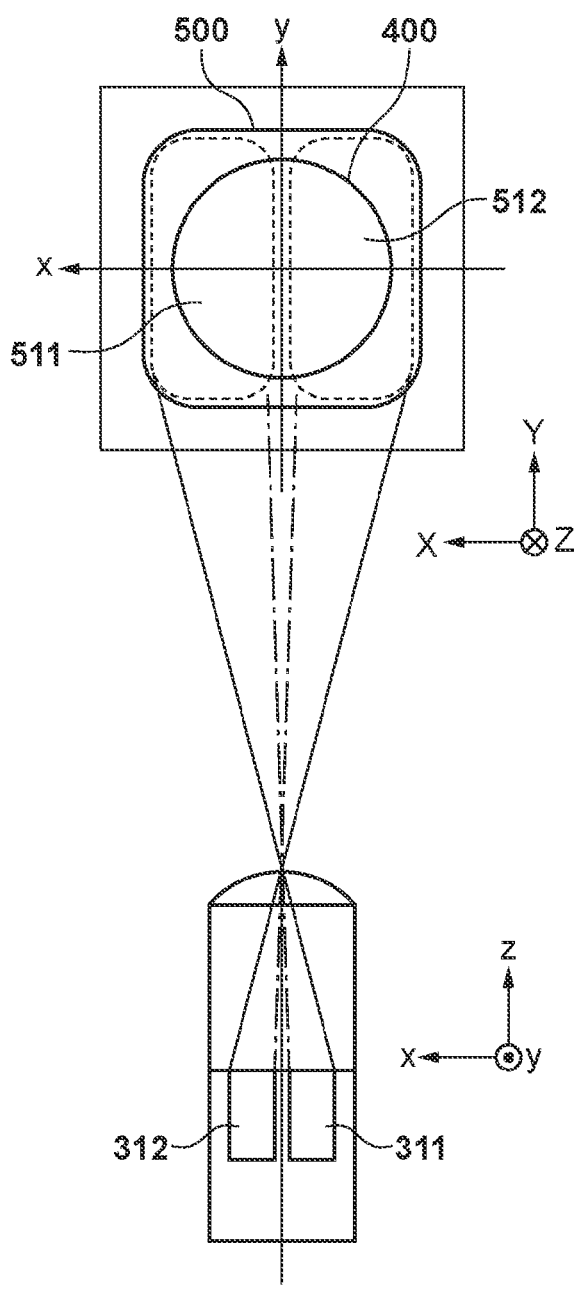
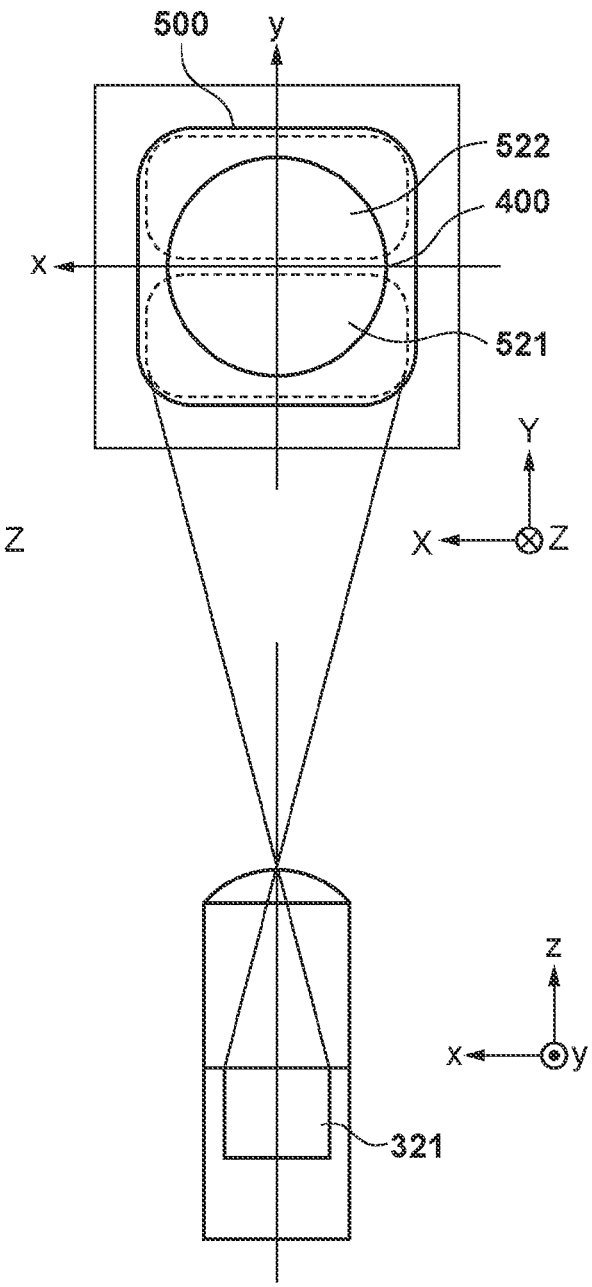

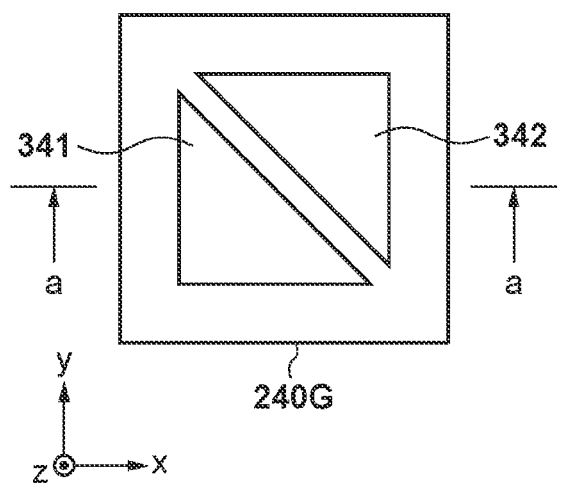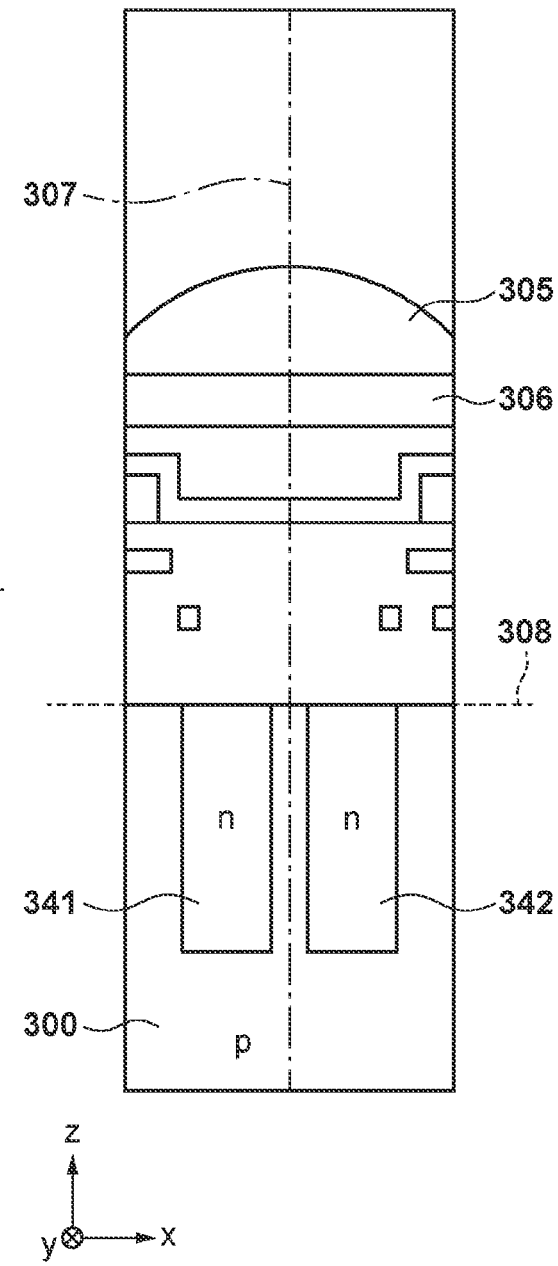

IMAGE SENSOR, IMAGE CAPTURING APPARATUS, FOCUS DETECTION APPARATUS, IMAGE PROCESSING APPARATUS, AND CONTROL METHOD OF IMAGE CAPTURING APPARATUS USING PUPIL DIVISION IN DIFFERENT DIRECTIONS

BACKGROUND OF THE INVENTION

Field of the Invention

The present invention relates to an image sensor, an image capturing apparatus, a focus detection apparatus, an image processing apparatus, and a method of controlling the same.

Description of the Related Art

As a focus detection method of an image capturing apparatus, an image capturing surface phase difference method in which a phase difference method focus detection is performed in accordance with a focus detection pixel formed on an image sensor is known.

Japanese Patent Laid-Open No. S58-024105 discloses an image capturing apparatus that uses a microlens and an image sensor in which a plurality of divided photoelectric conversion regions are formed for one pixel. Each divided photoelectric conversion region receives a light beam in each of different regions of an exit pupil via the microlens, realizing pupil division. The image capturing apparatus can perform the phase difference method focus detection by obtaining an image shift amount from signals (parallax signals) for which there is a parallax obtained by the pupil division. In addition, Japanese Patent Laid-Open No. 2001-083407 discloses a technique of generating an image signal by adding parallax signals received by divided photoelectric conversion regions.

However, to obtain parallax signals for more viewpoints from the image sensor, it is necessary to increase the number of divisions of the photoelectric conversion region for one pixel, but there is the problem that if the total number of signal reads for the photoelectric conversion region increases, it leads to an increase of a signal amount and power consumption.

SUMMARY OF THE INVENTION

The present invention has been made in consideration of the aforementioned problems, and realizes a technique that can obtain parallax signals from more viewpoints while suppressing a total number of signal reads for a photoelectric conversion region of one pixel.

In order to solve the aforementioned problems, the present invention provides an image sensor in which pixels, each having a photoelectric conversion region divided into a plurality of regions, are arranged two-dimensionally, the image sensor comprising: a first pixel, from the pixels, for which each of photoelectric conversion regions divided in a first direction receives a light beam that passes through a pupil region of an imaging optical system that corresponds to each of photoelectric conversion regions; and a second pixel, from the pixels, for which each of photoelectric conversion regions divided in a second direction different to the first direction receives a light beam that passes through the pupil region of the imaging optical system that corresponds to each of photoelectric conversion regions; wherein the first pixel outputs signals having parallax in the first direction from the photoelectric conversion regions divided in the first direction, and the second pixel outputs signals having parallax in the second direction from the photoelectric conversion regions divided in the second direction.

In order to solve the aforementioned problems, the present invention provides an image capturing apparatus comprising: an image sensor in which pixels, each having a photoelectric conversion region divided into a plurality of regions, are arranged two-dimensionally, wherein the image sensor comprises: a first pixel, from the pixels, for which each of photoelectric conversion regions divided in a first direction receives a light beam that passes through a pupil region of an imaging optical system that corresponds to each of photoelectric conversion regions; and a second pixel, from the pixels, for which each of photoelectric conversion regions divided in a second direction different to the first direction receives a light beam that passes through the pupil region of the imaging optical system that corresponds to each of photoelectric conversion regions, and wherein the first pixel outputs signals having parallax in the first direction from the photoelectric conversion regions divided in the first direction, and the second pixel outputs signals having parallax in the second direction from the photoelectric conversion regions divided in the second direction.

In order to solve the aforementioned problems, the present invention provides a focus detection apparatus comprising: an image sensor in which pixels, each having a photoelectric conversion region divided into a plurality of regions, are arranged two-dimensionally, the image sensor comprising a first pixel, from the pixels, for which each of photoelectric conversion regions divided in a first direction receives a light beam that passes through a pupil region of an imaging optical system that corresponds to each of photoelectric conversion regions and a second pixel, from the pixels, for which each of photoelectric conversion regions divided in a second direction different to the first direction receives a light beam that passes through the pupil region of the imaging optical system that corresponds to each of photoelectric conversion regions, wherein the first pixel outputs signals having parallax in the first direction from the photoelectric conversion regions divided in the first direction, and the second pixel outputs signals having parallax in the second direction from the photoelectric conversion regions divided in the second direction; a calculation unit configured to obtain a signal output from the image sensor that includes a first signal output from the first pixel and a second signal output from the second pixel, and to calculate a defocus amount that represents a distance between an image forming position and an image capturing surface based on at least one of the first signal and the second signal; and a detection unit configured to perform focus detection based on the calculated defocus amount.

In order to solve the aforementioned problems, the present invention provides an image processing apparatus comprising: an image sensor in which pixels, each having a photoelectric conversion region divided into a plurality of regions, are arranged two-dimensionally, the image sensor comprising a first pixel, from the pixels, for which each of photoelectric conversion regions divided in a first direction receives a light beam that passes through a pupil region of an imaging optical system that corresponds to each of photoelectric conversion regions and a second pixel, from the pixels, for which each of photoelectric conversion regions divided in a second direction different to the first direction receives a light beam that passes through the pupil region of the imaging optical system that corresponds to each of photoelectric conversion regions, wherein the first pixel outputs signals having parallax in the first direction from the photoelectric conversion regions divided in the first direction, and the second pixel outputs signals having parallax in the second direction from the photoelectric conversion regions divided in the second direction; an obtaining unit configured to obtain a signal output from the image sensor that includes a first signal output from the first pixel and a second signal output from the second pixel; and a generation unit configured to generate, based on the first signal and the second signal, parallax images having a number of parallaxes that is more than a number of parallaxes obtained by dividing the photoelectric conversion region.

In order to solve the aforementioned problems, the present invention provides a control method of an image processing apparatus having: an image sensor in which pixels, each having a photoelectric conversion region divided into a plurality of regions, are arranged two-dimensionally, the image sensor comprising a first pixel, from the pixels, for which each of photoelectric conversion regions divided in a first direction receives a light beam that passes through a pupil region of an imaging optical system that corresponds to each of photoelectric conversion regions, and a second pixel, from the pixels, for which each of photoelectric conversion regions divided in a second direction different to the first direction receives a light beam that passes through the pupil region of the imaging optical system that corresponds to each of photoelectric conversion regions, the method comprising: obtaining a signal output from the image sensor, in which the first pixel outputs signals having parallax in the first direction from the photoelectric conversion regions divided in the first direction, and the second pixel outputs signals having parallax in the second direction from the photoelectric conversion regions divided in the second direction, that includes a first signal output from the first pixel and a second signal output from the second pixel; and generating, based on the first signal and the second signal, parallax images having a number of parallaxes that is more than a number of parallaxes obtained by dividing the photoelectric conversion region.

According to the present invention, it is possible to obtain more parallax signals while suppressing a total number of signal reads for a photoelectric conversion region for one pixel.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 4 is a view explaining a relation between pupil division and the first pixel according to the first embodiment.

FIG. 5 is a view explaining a relation between pupil division and the second pixel according to the first embodiment.

FIGS. 10A and 10B are respectively a plan view and a cross-sectional view that schematically show the second pixel according to the second embodiment.

DESCRIPTION OF THE EMBODIMENTS

First Embodiment

Exemplary embodiments of the present invention will be described hereinafter in detail, with reference to the accompanying drawings. Note that below, as an example of an image sensor, explanation is given of an example in which an image sensor that is provided with a plurality of photoelectric conversion regions and a microlens for each pixel is applied to the present invention. However, the image sensor in the present invention is not limited to an image sensor provided with a microlens for each pixel, and the present invention is also applicable to an image sensor provided with a microlens for a plurality of pixels, or an image sensor provided with a plurality of photoelectric conversion regions and a microlens for a portion of pixels of the image sensor. In addition, as an example of the image capturing apparatus, explanation is given of a digital camera provided with an image sensor to which the present invention is applied, as an example. However, the scope of the present invention is not limited to an image capturing apparatus such as a digital camera, and includes an image sensor, a focus detection apparatus, and an image processing apparatus.

(Configuration of Digital Camera 100)

Figure 1:
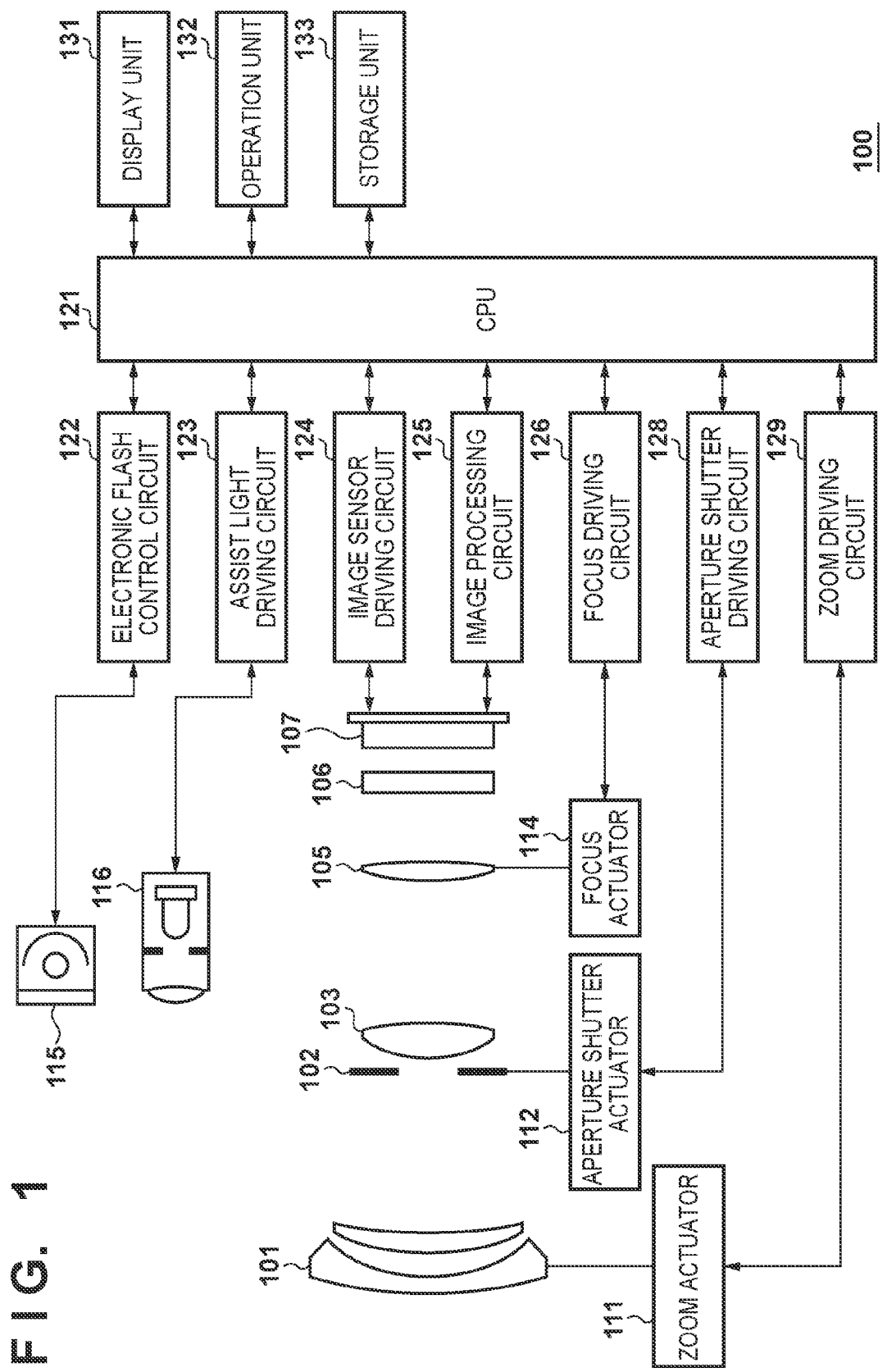
FIG. 1 is a block diagram for showing a functional configuration example of a digital camera as an example of an image capturing apparatus according to embodiments of the present invention.

FIG. 1 is a block diagram for showing a functional configuration example of a digital camera 100 which is an example of the image capturing apparatus of the present embodiment. In FIG. 1, a first lens group 101 is a lens group arranged at a leading end of an imaging optical system, and is held so as to be movable in an optical axis direction. An aperture shutter 102 performs light amount adjustment at a time of capturing by adjusting an aperture diameter thereof, and is also provided with a function as an exposure time control shutter at a time of still image shooting. A second lens group 103 and the aperture shutter 102 move forward/backward in the optical axis direction as a single body, and realize a scaling action (a zoom function) by interworking with a forward/backward movement operation of the first lens group 101. A third lens group 105 includes a focusing lens, and performs focus adjustment by forward/backward movement in the optical axis direction. A low-pass filter 106 is an optical element for reducing moire, which is an interference fringe, or a false color, which is color that is not actually there that is reproduced.

An image sensor 107 includes, for example, a CMOS photosensor and a peripheral circuit which are arranged two-dimensionally, and is arranged in an imaging plane of the imaging optical system. As will be explained later separately, the image sensor 107 has a plurality of the photoelectric conversion regions and a microlens for each pixel, and can output a plurality of parallax signals.

A zoom actuator 111 is an actuator that controls the forward/backward movement operation of the first lens group 101 through to the third lens group 105, and performs a scaling operation by driving forward/backward movement of the first lens group 101 or the like along the optical axis direction by rotating a cam barrel (not shown). An aperture shutter actuator 112 is an actuator that controls the aperture shutter 102, and adjusts an ambient light amount by controlling the aperture diameter of the aperture shutter 102, and also performs exposure time control at a time of still image shooting. A focus actuator 114 performs focus adjustment by driving forward/backward movement of the focusing lens in the optical axis direction.

A flash 115 is an electronic flash for photographic subject illumination upon capturing, and for example is a flash illumination device that uses a xenon flashtube, but may use an illumination apparatus that is provided with an LED that continuously emits light. An AF assist apparatus 116 emits an AF assist light, and projects an image of a mask that has a predetermined aperture pattern into a field of view via a projecting lens. By using the AF assist apparatus 116, it is possible to improve a focus detection capability with respect to a dark photographic subject or a low-contrast photographic subject.

A control unit 121 for example includes a CPU or an MPU, and has a ROM, a RAM, an arithmetic unit, an A/D converter, a D/A converter, a communication interface circuit, or the like (not shown). The control unit 121 controls various circuits of the digital camera 100 and realizes overall operation, such as AF, capturing, image processing, recording, or the like, by loading a predetermined program that is stored in the ROM into a work area of the RAM.

An electronic flash control circuit 122 is a control circuit connected to the flash 115, and in accordance with an instruction of the control unit 121 controls lighting of the flash 115 in synchronization with an image capturing operation. An assist light driving circuit 123 is a control circuit connected to the AF assist apparatus 116, and in accordance with an instruction of the control unit 121, controls lighting of the AF assist apparatus 116 in synchronization with a focus-detecting operation. An image sensor driving circuit 124 is a control circuit connected to the image sensor 107, and controls an image capturing operation of the image sensor 107, and also performs A/D conversion of an obtained image signal and transmits it to the control unit 121.

An image processing circuit 125, for example, includes a dedicated processor such as an ASIC, and performs γ transformation, color interpolation, JPEG compression, or the like with respect to image data read from the image sensor 107.

A focus driving circuit 126 performs driving control of the focus actuator 114 based on a focus detection result according to the control unit 121, and performs focus adjustment by driving to perform forward/backward movement of the focusing lens in the optical axis direction. An aperture shutter driving circuit 128 performs driving control of the aperture shutter actuator 112 to control the aperture of the aperture shutter 102. A zoom driving circuit 129 performs driving control of the zoom actuator 111 based on a control amount in accordance with a zoom operation by a photographer.

A display unit 131 for example includes a display apparatus, such as an LCD, and for example, displays information regarding an image capturing mode of the digital camera 100, preview images before capturing, an image for confirming after image capturing, an image for confirming an in-focus state at a time of focus detection, or the like.

An operation unit 132 includes a button, dial, or touch panel for operating the digital camera 100, and, for example, is comprised by a power supply switch, a release (capturing trigger) switch, a zoom operation switch, an image capturing mode selection switch, the display unit 131, or the like.

A storage unit 133 is, for example, a recording medium that can electrically delete/record and comprises an EEPROM or the like, and stores a captured image.

(Configuration of the Image Sensor 107)

Figure 2:
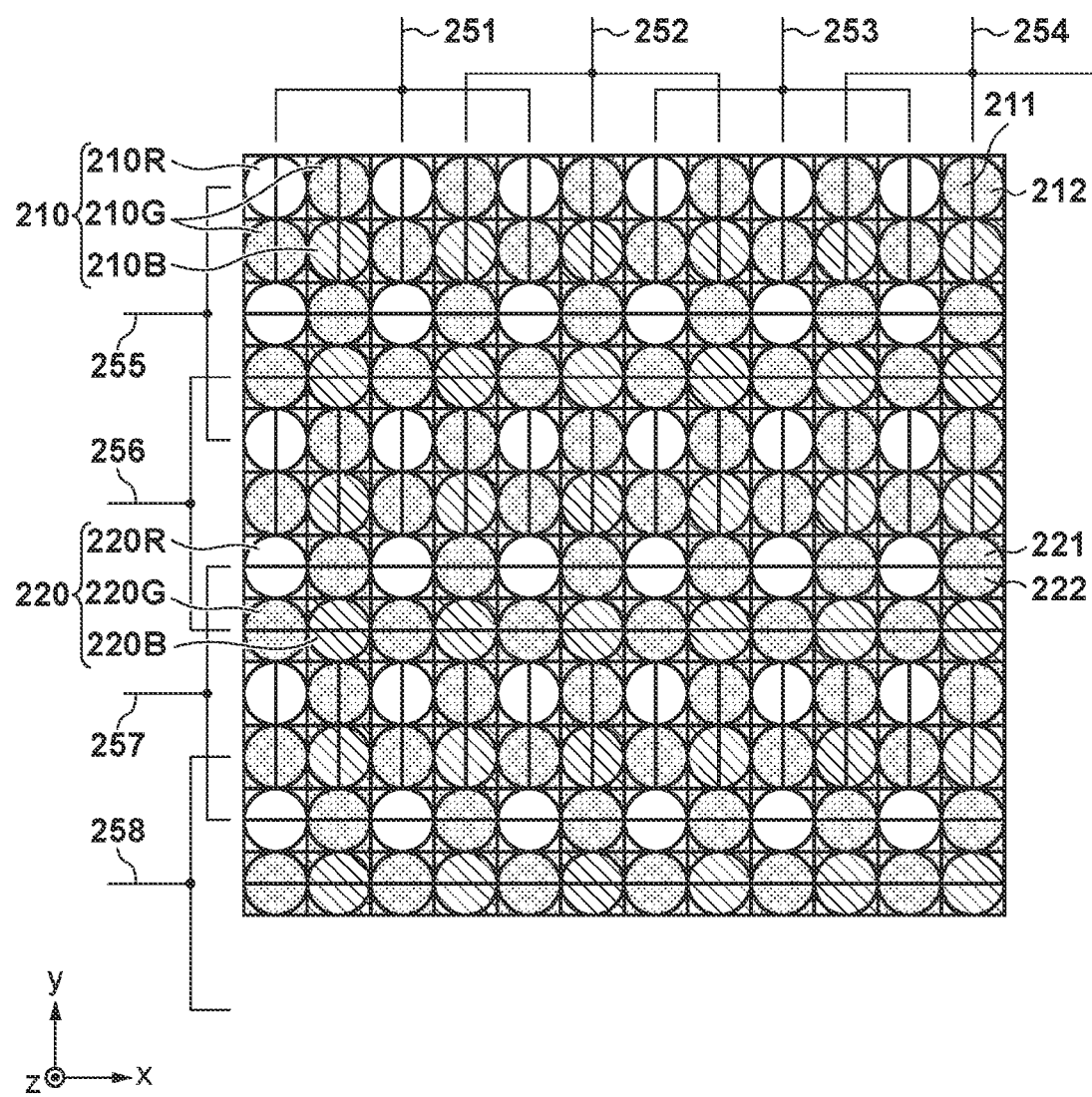
FIG. 2 is a view for illustrating schematically a pixel array according to a first embodiment.

Next, with reference to FIG. 2, explanation is given of an array of subpixels and pixels of an image sensor as an example according to the present embodiment. FIG. 2 shows an array of pixels arranged two-dimensionally, with a range of 12 columns×12 rows. Note that x-axis, y-axis, and z-axis directions respectively indicate a horizontal direction, a vertical direction, and the optical axis direction of the digital camera 100.

A pixel group according to the present embodiment is, for example, comprised by four pixels arranged in two columns×two rows as one unit, and is comprised by pixels that have spectral sensitivity of one color of RGB. For example, a pixel group 210 is comprised by a Bayer array in which a pixel 210R having spectral sensitivity for R (red) is arranged in the top-left, pixels 210G having spectral sensitivity for G (green) are arranged in the top-right and the bottom-left, and a pixel 210B having spectral sensitivity for B (blue) is arranged in the bottom-right. Each pixel that comprises the pixel group 210 (referred to as first pixels) is configured so as to output a signal by a configuration of a subpixel 211 and a subpixel 212 arranged in two columns×one row.

A pixel group 220 is configured similarly to the pixel group 210 as one unit of four pixels arranged in two columns×two rows. The pixel group 220 is comprised by a pixel 220R having spectral sensitivity for R (red) is arranged in the top-left, pixels 220G having spectral sensitivity for G (green) are arranged in the top-right and the bottom-left, and a pixel 220B having spectral sensitivity for B (blue) is arranged in the bottom-right. Each pixel that comprises the pixel group 220 (referred to as second pixels), unlike in the pixel group 210, is configured so as to output a signal by a configuration of a subpixel 221 and a subpixel 222 arranged in one column×two rows.

In the example shown in FIG. 2, in the array of pixels in 12 rows×12 columns, the first pixels (in other words, pixels configured so as to output the signal in accordance with the configuration of the subpixel 211 and the subpixel 212) are arranged in the first and second rows from the top. On the other hand, the second pixels (in other words, the pixels configured so as to output a signal by the configuration of the subpixel 221 and the subpixel 222) are arranged in the third and fourth rows. In the present embodiment, two rows of first pixels and second pixels are alternatingly arranged as one unit.

In the pixel arrangement example of 12 columns×12 rows, the pixels that comprise the pixel group 210 and the pixels that comprise the pixel group 220 are arranged in a planar form, and image signals (indicates a signal output for each subpixel, so also referred to as a subpixel signal) are obtained. In the present embodiment, explanation is given of an example of an image sensor for which a period P at which the first pixels and the second pixels are present is 4 µm, and a number of pixels N is in the horizontal 5575 columns×in the vertical 3725 rows=approximately 20.75 million pixels.

The image sensor 107 of the present embodiment has a plurality of signal read modes of a read-all mode and an additive thinning readout mode; it is possible to switch the modes in accordance with a capturing function. In the case of still image shooting, 4K moving image capturing, or the like, the read-all mode is applied, in which all pixel signals are read without performing addition or thinning readout. However, with FHD (Full HD) moving image capturing or live view capturing, the additive thinning readout mode indicated by connections 251-258 of FIG. 2 is used. A signal is read in a state in which a signal amount is suppressed by performing, for the horizontal direction, three pixel addition that keeps equal intervals for a color centroid by the connections 251-254, and, for the vertical direction, two/three pixel addition (a combination of three pixel thinning and two pixel addition) that keeps equal intervals for a color centroid by the connections 255-258.

To allow the image that is to be output to support a plurality of resolutions, the image sensor 107 can further include a signal obtaining unit (not shown) that samples, for example, pixels arrayed along the vertical direction for each odd numbered column, and performs reading in accordance with addition, thinning, or a combination of these. Note that by adding (for example, in a first pixel adding the signals of the subpixel 211 and the subpixel 212) the signals of subpixels for each pixel of the image sensor 107, it is possible to generate an image signal of a resolution of an effective number of pixels N.

Figure 3A:
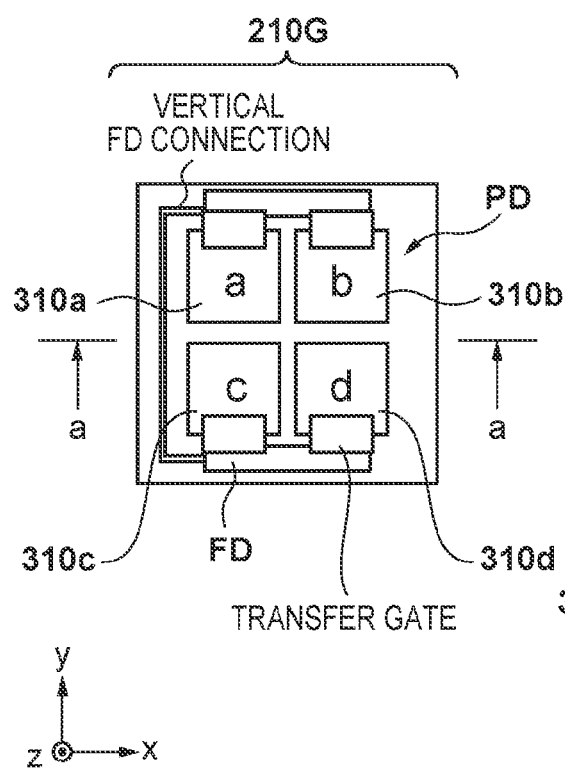
FIGS. 3A and 3B are respectively a plan view and a cross-sectional view that schematically show a first pixel and a second pixel according to the first embodiment.
Figure 3B:
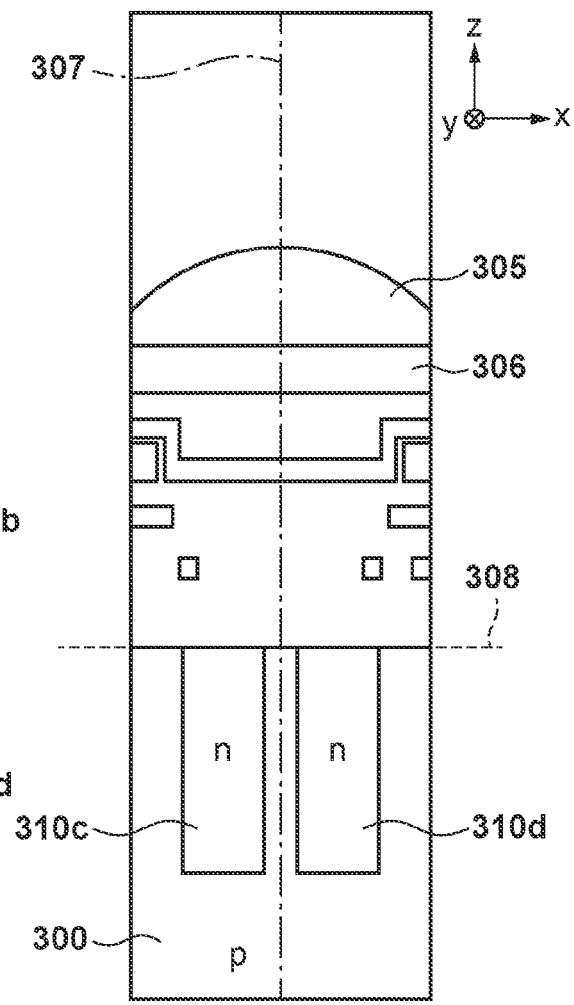

Next explanation is given with reference to FIG. 3A and FIG. 3B regarding an internal structure of the image sensor 107.

As an example of a first pixel that comprises the image sensor 107, the pixel 210G is shown on FIG. 3A in a plan view from the perspective of a light-receiving surface side (+z side) of the image sensor 107 and shown on FIG. 3B as a cross-sectional view of an a-a cross-section of FIG. 3A from the perspective of a −y side. Note that each direction of the x-z axes shown on FIG. 3A and FIG. 3B corresponds to a respective direction shown on FIG. 2, and the reference numerals 307 and 308 respectively indicate the optical axis and the light-receiving surface.

As shown in FIG. 3A, the pixel 210G has two photoelectric conversion regions in each of the horizontal direction and the vertical direction. As shown on the cross-sectional view of FIG. 3B, a microlens 305 for focusing light incident on a light-receiving side (+z direction) of the pixel 210G is formed. A photoelectric conversion unit 310a through to a photoelectric conversion unit 310d are each independently arranged in a configuration that is divided into two by each of the horizontal direction and the vertical direction. By simultaneously opening/closing transfer gates of the photoelectric conversion unit 310a and the photoelectric conversion unit 310c, a photoelectric conversion unit 311 that combines the photoelectric conversion unit 310a and the photoelectric conversion unit 310c in the vertical direction is configured. By simultaneously opening/closing transfer gates of the photoelectric conversion unit 310b and the photoelectric conversion unit 310d, a photoelectric conversion unit 312 that combines the photoelectric conversion unit 310b and the photoelectric conversion unit 310d in the vertical direction is configured. The photoelectric conversion unit 311 and the photoelectric conversion unit 312 respectively correspond to the subpixel 211 and the subpixel 212.

Each of the above described photoelectric conversion units 310a to 310d is, for example, a PIN-structure photodiode in which an intrinsic layer is sandwiched between a p-type layer and an n-type layer, but these may be p-n junction photodiodes that omit the intrinsic layer as appropriate.

In addition, a color filter 306 is formed between the microlens 305 and the photoelectric conversion units 310a to 310d, and allows wavelengths of one of RGB from an incident light beam to pass through. In addition, as necessary, a spectral transmission factor of the color filter may be changed for each subpixel, or the color filter may be omitted.

By first pixels (for example, the pixel 210G) having the above described configuration, a light beam incident on the pixel is focused by the microlens 305 and is also dispersed by the color filter 306, and received by the photoelectric conversion units 310a to 310d. In the photoelectric conversion units 310a to 310d, after a pair of an electron and a hole are generated in response to a received light amount and separated in a depletion layer, the negatively-charged electron is stored in the n-type layer. In contrast, the hole is discharged to outside the image sensor through a p-type layer 300 connected to a constant-voltage power supply (not shown). The electron stored in the n-type layer of the photoelectric conversion units 310a to 310d is transferred to a static capacitance unit (FD) via a transfer gate (not shown), and is converted to a voltage signal. In this way, the signal received by each of the photoelectric conversion units 310a to 310d is output.

Similarly, one second pixel 220G of the image sensor shown in FIG. 2 is shown in FIG. 3A in a plan view from the perspective of a light-receiving surface side (+z side) of the image sensor and shown in FIG. 3B as a cross-sectional view of an a-a cross-section of FIG. 3A from the perspective of the −y side. Pixel structure is the same for the first pixel 210G and the second pixel 220G.

As shown in FIG. 3A, the pixel 220G has two photoelectric conversion regions in each of the horizontal direction and the vertical direction. As shown on the cross-sectional view of FIG. 3B, the microlens 305 for focusing light incident on a light-receiving side (+z direction) of the pixel 220G is formed. Similarly to the pixel 210G described above, for pixel 220G, the photoelectric conversion unit 310a through to the photoelectric conversion unit 310d are each independently arranged in a configuration that is divided into two by each of the horizontal direction and the vertical direction. By simultaneously opening/closing transfer gates of the photoelectric conversion unit 310a and the photoelectric conversion unit 310b, a photoelectric conversion unit 321 that combines the photoelectric conversion unit 310a and the photoelectric conversion unit 310b in the horizontal direction is configured. By simultaneously opening/closing transfer gates of the photoelectric conversion unit 310c and the photoelectric conversion unit 310d, a photoelectric conversion unit 322 that combines the photoelectric conversion unit 310c and the photoelectric conversion unit 310d in the horizontal direction is configured. The photoelectric conversion unit 321 and the photoelectric conversion unit 322 respectively correspond to the subpixel 221 and the subpixel 222.

(Correspondence Between Pixel Structure and Pupil Division)

The correspondence between pupil division and the structure of the first pixel shown in FIG. 3A and FIG. 3B will be explained with reference to FIG. 4. FIG. 4 shows an exit pupil surface (a top side) of the imaging optical system, and a cross-sectional view (a bottom side) of an a-a cross-section in the structure of the first pixel shown in FIG. 3A from the perspective of the +y side. In FIG. 4, to obtain a correspondence with coordinate axes of the exit pupil surface, the x-axis and the y-axis of the cross-sectional view are caused to be reversed with respect to FIG. 3B.

A pupil sub-region 511 of the subpixel 211 represents a pupil region capable of receiving light in the subpixel 211, and in accordance with the microlens, is mainly conjugate with light-receiving surface of the photoelectric conversion unit 311, whose centroid is decentered in the −x direction. The centroid of the pupil sub-region 511 of the subpixel 211 is decentered in a +x side on a pupil plane.

Meanwhile, a pupil sub-region 512 of the subpixel 212 represents a pupil region capable of receiving light in the subpixel 212, and in accordance with the microlens, is mainly conjugate with light-receiving surface of the photoelectric conversion unit 312, whose centroid is decentered in the +x direction. The centroid of the pupil sub-region 512 of the subpixel 212 is decentered in a −x side on a pupil plane. Note that a pupil region 500 is a pupil region capable of receiving light in the pixel 210G overall when the photoelectric conversion unit 311 and the photoelectric conversion unit 312 (the subpixel 211 and the subpixel 212) are wholly combined.

The correspondence between pupil division and the structure of the second pixel shown in FIG. 3A and FIG. 3B will be explained with reference to FIG. 5. FIG. 5 shows an exit pupil surface (a top side) of the imaging optical system, and a cross-sectional view (a bottom side) of an a-a cross-section in the structure of the second pixel shown in FIG. 3A from the perspective of the +y side. In FIG. 5, similarly to in FIG. 4, to obtain a correspondence with coordinate axes of the exit pupil surface, the x-axis and the y-axis of the cross-sectional view are caused to be reversed with respect to FIG. 3B.

A pupil sub-region 521 of the subpixel 221 represents a pupil region capable of receiving light in the subpixel 221, and in accordance with the microlens, is mainly conjugate with light-receiving surface of the photoelectric conversion unit 321, whose centroid is decentered in the +y direction. The centroid of the pupil sub-region 521 of the subpixel 221 is decentered in a −y side on a pupil plane.

Similarly, a pupil sub-region 522 of the subpixel 222 represents a pupil region capable of receiving light in the subpixel 222, and in accordance with the microlens, is mainly conjugate with light-receiving surface of the photoelectric conversion unit 322, whose centroid is decentered in the −y direction. The centroid of the pupil sub-region 522 of the subpixel 222 is decentered in a +y side on a pupil plane. Note that the pupil region 500 is a pupil region capable of receiving light in the pixel 220G overall when the photoelectric conversion unit 321 and the photoelectric conversion unit 322 (the subpixel 221 and the subpixel 222) are wholly combined.

Figure 6:
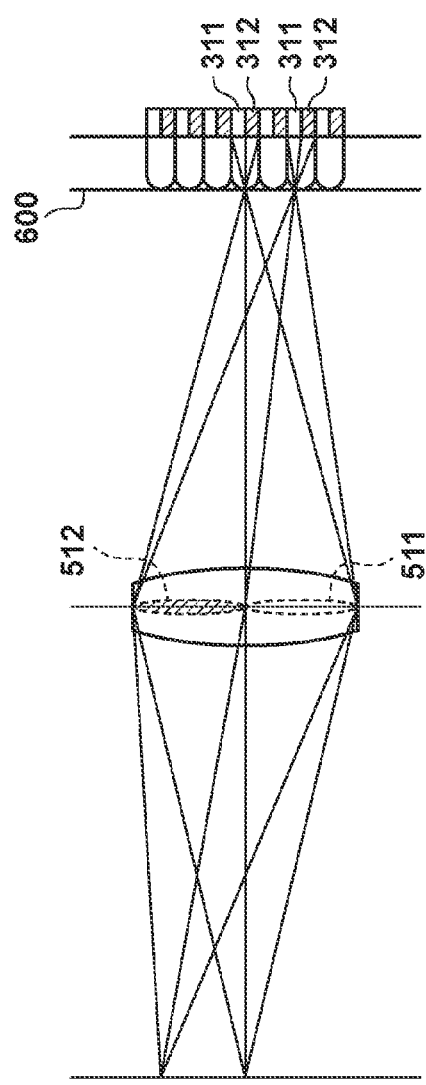
FIG. 6 is a view explaining a relation between pupil division and an image sensor according to the first embodiment.

Further explanation is given with reference to FIG. 6 regarding correspondence between the image sensor 107 and pupil division. Light beams that pass through the pupil sub-region 511 and the pupil sub-region 512, which are different pupil sub-regions, is incident on each photoelectric conversion unit of the image sensor 107 at respectively different angles, and received by the subpixel 211 and the subpixel 212 which are divided in the horizontal direction. Similarly, the subpixel 221 and the subpixel 222, which are divided along the vertical direction, respectively receive light beams that pass through the pupil sub-region 521 and the pupil sub-region 522, which are divided along the vertical direction.

In this way, the image sensor 107 receives light beams that pass through pupil sub-regions that differ in the horizontal direction by subpixels that are divided in the horizontal direction for the first pixels, and receives the light beam that passes through the pupil sub-regions that differ in the vertical direction by subpixels that are divided in the vertical direction for the second pixels. Accordingly, the image sensor 107 can output parallax signals having parallax in the vertical direction and parallax signals having parallax in the horizontal direction. In other words, while the number of divisions of the photoelectric conversion units with respect to each microlens is two, it is possible to obtain four parallax signals (four parallax signals according to two×two divisions).

For the image sensor 107, a row in which first pixels is arranged and a row in which second pixels is arranged, for which the direction of pupil division is different, are alternatingly arranged every two rows. By arranging each pixel in this way, it is possible to perform the addition of the three pixels in the horizontal direction shown in FIG. 2 for every four subpixels corresponding to different pupil sub-regions. It is also possible to perform the 2/3 pixel addition (the combination of three pixel thinning and two pixel addition) of the vertical direction shown in FIG. 2 for every four subpixels that correspond to different pupil sub-regions. Accordingly, to cause the image output to support the plurality of resolutions, it is possible to perform sampling, and then perform addition, thinning or a combination of these for every four subpixels that correspond to different pupil sub-regions.

(Relation Between Defocus Amount and Image Shift Amount)

Next, with reference to FIG. 7, explanation will be given of a relation between a defocus amount and an image shift amount of two subpixel signals obtained by the image sensor 107.

Figure 7:
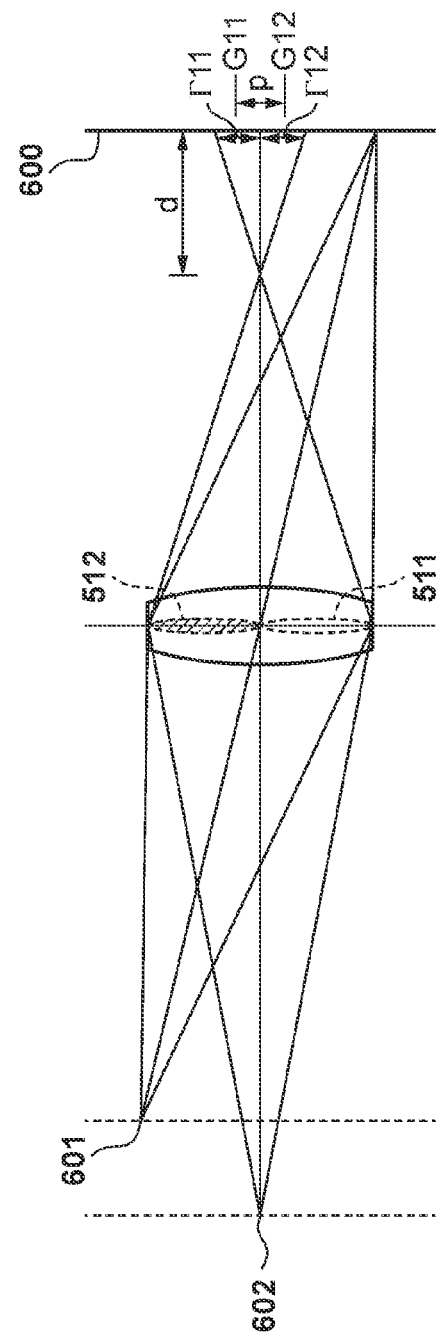
FIG. 7 is a view explaining an image shift amount and a defocus amount of a first subpixel signal and a second subpixel signal according to the first embodiment.

For a first subpixel signal output by the subpixel 211 and a second subpixel signal output by the subpixel 212 that configure a first pixel, FIG. 7 schematically illustrates the defocus amount of the second subpixel signal and the first subpixel signal and the image shift amount between the subpixel signals. The image sensor 107 is arranged on an image capturing surface 600, and an exit pupil of the imaging optical system as shown in FIG. 3A, FIG. 3B and FIG. 4 is divided into the pupil sub-region 511 and the pupil sub-region 512.

A defocus amount d is defined as a magnitude |d| that is the distance from the image-forming position of the photographic subject to the image capturing surface 600; when the image-forming position of the photographic subject is on the side of the photographic subject rather than the image capturing surface 600 it has a negative sign (d<0), and when the image-forming position of the photographic subject is on a side opposite the photographic subject with respect to the image capturing surface it has a positive sign (d>0). An in-focus state in which the image-forming position of the photographic subject is at the image capturing surface (an in-focus position) is where d=0. A photographic subject 601 indicates an example of an in-focus state (d=0), and a photographic subject 602 indicates an example in which the image-forming position is in a state of being on the photographic subject side (d<0). A defocus state (|d|>0) combines when the image-forming position is on the photographic subject side (d<0) and when the image-forming position is on the opposite side to the photographic subject (d>0).

In a state in which the image-forming position is on the photographic subject side (d<0), from light beams radiated from the photographic subject 602, that light beams that pass through the pupil sub-region 511 focus once at a point separated by a distance |d| from the image capturing surface 600. Subsequently, there is a spread of a width Γ11 centered at a centroid position G11 of the light beam, and a blur image is formed on the image capturing surface 600. Similarly, the light beam that passes through the pupil sub-region 512 spreads to a width Γ12 centered at a centroid position G12 of the light beam on the image capturing surface 600, and forms a blur image.

The blur image is received by the subpixel 211 and the subpixel 212 that comprise the pixels that are arranged in the image sensor 107, and the first subpixel signal and the second subpixel signal are generated. In other words, the first subpixel signal records a subject image in which blur occurs for the photographic subject 602 by the width Γ11 at the centroid position G11 on the image capturing surface 600. Meanwhile, the second subpixel signal records a subject image in which blur occurs for the photographic subject 602 by the width Γ12 at a centroid position G12 on the image capturing surface 600. The blur width of the subject image (for example, Γ11) mainly increases in proportion to an accompanying increase of the magnitude |d| of the defocus amount d. For this reason, a magnitude |p| of an image shift amount p (=difference G11−G12 of center of gravity positions of light beams) of a subject image included in the first subpixel signal and the second subpixel signal also mainly increases in proportion to an accompanying increase of the magnitude |d| of the defocus amount d. Even in a state in which the image-forming position is on an opposite side to the photographic subject (d>0), an image shift direction of the subject image between the first subpixel signal and the second subpixel signal is opposite to when the image-forming position is on the photographic subject side, but the magnitude |p| of the image shift amount is the same.

This is similar for a third subpixel signal output by the subpixel 221 and a fourth subpixel signal output by the subpixel 222, which comprise a second pixel, except that the pupil-division direction is in the vertical direction instead of the horizontal direction.

Accordingly, in accordance with an increase in the magnitude of the defocus amount of each subpixel signal or the image signal that adds two subpixel signals, the magnitude of the image shift amount between the first (third) subpixel signal and the second (fourth) subpixel signal increases.

(Focus Detection Operation)

Further explanation is given for processing to perform focus detection by using subpixel signals output from the image sensor 107 according to the present embodiment. In the present focus detection operation, for example the image processing circuit 125 uses subpixel signals output from the image sensor 107 to perform a focus detection operation according to a phase difference method. More specifically, the image processing circuit 125 uses the first subpixel signal and the second subpixel signal which are pupil divided along the horizontal direction to perform a first focus detection, and uses the third subpixel signal and the fourth subpixel signal which are pupil divided along the vertical direction to perform a second focus detection.

In the first focus detection the image processing circuit 125 first causes the first subpixel signal and the second subpixel signal which are pupil divided along the horizontal direction to shift relatively, and repeatedly calculates an amount of correlation that represents a degree of matching of both signals. A first image shift amount is then detected based on a shift amount at which the calculated amount of correlation is relatively the highest (in other words, when both signals match best). As described above, because there is a relation in that the magnitude of the defocus amount of the image signal is proportional to the image shift amount between subpixel signals, the detected first image shift amount is converted into a first defocus amount and thereby focus detection is performed. Note that configuration may be taken so that the relation between the image shift amount and the defocus amount is caused to be stored as a predetermined characteristic in accordance with a characteristic of the imaging optical system and the image sensor 107, and the image processing circuit 125 calculates the first defocus amount based on the stored characteristic.

In the second focus detection, the image processing circuit 125 uses the third subpixel signal and the fourth subpixel signal which are pupil divided along the vertical direction to detect a second image shift amount, and calculates a second defocus amount based on the detected second image shift amount.

Note that configuration may be taken such that the image processing circuit 125 only performs the first focus detection or the second focus detection, and configuration may be taken to perform both focus detection operations and use the result of the detection processing for which the better result is obtained. In addition, configuration may be taken to use a statistical result, such as an average value of the results of both detection processes. If configuration taken so as to perform focus detection operation by using a set of a plurality of subpixel signals that have a parallax in different directions, it is possible to perform a more redundant focus detection operation with respect to a photographic subject that has various characteristics.

(Processing for Generating Parallax Images)

Explanation is given for processing for generating parallax images that uses the first to fourth subpixel signals (parallax signals for different directions) output from the image sensor 107 according to the present embodiment Note that in this processing, for example the image processing circuit 125 uses subpixel signals output from the image sensor 107 to perform parallax image generation processing.

A position in the x-direction of first pixels and second pixels of the image sensor 107 is set as i, and positions in the y-direction of first pixels and second pixels arranged in each two rows are j1 and j2 respectively.

At position (j1, i) of a first pixel, a first subpixel signal corresponding to the pupil sub-region 511 of the imaging optical system is set as HA(j1, i), and a second subpixel signal corresponding to the pupil sub-region 512 is set as HB(j1, i). Here, if j1 and i are caused to be changed in a range of effective pixels and a signal is read out, it is possible to generate a parallax image having parallax in a horizontal direction obtained for each two rows from pixel rows of the image sensor 107, respectively from the subpixel signal HA(j1, i) and the subpixel signal HB(j1, i).

At position (j2, i) of a second pixel, a third subpixel signal corresponding to the pupil sub-region 521 of the imaging optical system is set as VA(j2, i), and a fourth subpixel signal corresponding to the pupil sub-region 522 is set as VB(j2, i). Here, if j2 and i are caused to be changed in a range of effective pixels and a signal is read out, it is possible to generate a parallax image having parallax in a vertical direction obtained for each two rows from pixel rows of the image sensor 107, respectively from the subpixel signal VA(j2, i) and the subpixel signal VB(j2, i).

In this respect, in the present embodiment, one set of parallax images having parallax in horizontal and vertical directions are generated. In other words, parallax images having four different viewpoints are generated based on the subpixel signal HA(j1, i), the subpixel signal HB(j1, i), the subpixel signal VA(j2, i) and the subpixel signal VB(j2, i).

Specifically, at position (j1, i) of the first pixel, a parallax image A(j1, i), a parallax image B(j1, i), a parallax image C(j1, i), and a parallax image D(j1, i) are respectively generated from Equation (1A) to Equation (1D). From the parallax images having four viewpoints divided by the horizontal and vertical directions, for example, generation of the parallax image A(j1, i) having a top-left viewpoint is considered. The parallax image A(j1, i) is generated by using the subpixel signal HA(j1, i) having the viewpoint of the left side and the subpixel signal having the viewpoint of the top side. At this point, because coordinates (j1, i) only comprises subpixel signals that have parallax in the horizontal direction (in other words, only the subpixel signals of the first pixel), subpixel signals read out from an adjacent second pixel are used to generate approximate subpixel signal values. For generation of approximate values, for example as shown in the following equations, by averaging subpixel signals at the coordinates (j1−2, i) and coordinates (j1+2, i), a subpixel signal having the viewpoint of the top side at coordinates (j1, i) is generated. In this way, it is possible to generate a signal having low noise at coordinates (j1, i), and in addition, high speed computation is possible by a simple method. Similar processing is performed for other viewpoints (bottom-left, top-right, bottom-right).

$$A(j1, i) = HA(j1, i) \times \frac{VA(j1-2, i) + VA(j1+2, i)}{2}$$ [EQUATION 1]

$$B(j1, i) = HB(j1, i) \times \frac{VA(j1-2, i) + VA(j1+2, i)}{2}$$

$$C(j1, i) = HB(j1, i) \times \frac{VB(j1-2, i) + VB(j1+2, i)}{2}$$

$$D(j1, i) = HA(j1, i) \times \frac{VB(j1-2, i) + VB(j1+2, i)}{2}$$

Specifically, at position (j2, i) of a second pixel, a parallax image A (j2, i), a parallax image B (j2, i), a parallax image C (j2, i), and a parallax image D (j2, i) are respectively generated from Equation (2A) to Equation (2D). More specifically, in generation of pixel values of each viewpoint at position (j2, i) of the second pixel, because subpixel signals having parallax in the horizontal direction are not present, approximate values obtained from adjacent subpixel signals having parallax in the horizontal direction is used. In other words, for generation of pixel values of each viewpoint, approximate signals obtained from subpixel signals having parallax in an upward/downward orientation and subpixel signals having parallax in a leftward/rightward orientation are used to perform the generation. Generation of the approximate signals is, for example, performed by averaging subpixel signal HA or subpixel signal HB at coordinates (j2−2, i) and coordinates (j2+2, i).

$$A(j2, i) = \frac{HA(j2-2, i) + HA(j2+2, i)}{2} \times VA(j2, i)$$ [EQUATION 2]

$$B(j2, i) = \frac{HB(j2-2, i) + HB(j2+2, i)}{2} \times VA(j2, i)$$

-continued $$C(j2, i) = \frac{HB(j2-2, i) + HB(j2+2, i)}{2} \times VB(j2, i)$$

$$D(j2, i) = \frac{HA(j2-2, i) + HA(j2+2, i)}{2} \times VB(j2, i)$$

In this way, it is possible to generate four different parallax images corresponding to the top-right, the top-left, the bottom-left, and the bottom-right from the first to the fourth subpixel signals.

Note that, in processing for generating parallax images according to the present embodiment, explanation was given of a method of generating parallax images by using all pixels that are effective pixels of the image sensor 107, but configuration may be taken to generate the parallax image with respect to pixels that are sampled at a fixed period. In this way, for example, it is possible to generate parallax images of an appropriate resolution, in accordance with a readout mode corresponding to a user operation.

As explained above, in the present embodiment, configuration is such that the image sensor 107 reads signal from first pixels having subpixels for which the photoelectric conversion region is divided in a horizontal direction, and second pixels having subpixels for which the photoelectric conversion region is divided in a vertical direction. With such a configuration, even if the number of divisions of the photoelectric conversion region is spuriously made to be two, it is possible to obtain parallax signals having parallax in the horizontal direction and the vertical direction by one exposure. In other words, by reading pixels for which the method in which the photoelectric conversion region is divided is made to be different, it is possible to obtain parallax signals for more viewpoints. Accordingly, it is possible to obtain parallax signals for more viewpoints while suppressing the total number of signal reads for the photoelectric conversion region for single pixels.

In addition, in an arrangement of pixels for which the division method of the photoelectric conversion regions is different, configuration is such that pixels for which the division method is the same are arranged to be adjacent in one direction, and in an orthogonal direction pixels having a different division method are arranged alternatingly by a predetermined unit. In particular, when pixels are comprised by a Bayer array, configuration is such that first pixels and second pixels for which the division method differs are arranged alternatingly two pixels at a time. With such a configuration, in parallax image generation processing, it is possible to perform generation of parallax images with a greater number of viewpoints easily and with good quality.

Furthermore, the plurality of parallax signals output from the image sensor can be said to be equivalent to Light Field (LF) data on the point that light intensity spatial distribution and angle distribution information is comprised. Accordingly, the image processing circuit 125 may be configured to use the obtained parallax signals to compose an image at a virtual image forming plane that is different to the image capturing surface, and generate a refocus image for which the in-focus position is changed after image capturing. By obtaining parallax signals of more viewpoints, it is possible to generate a refocus image having higher precision, while suppressing a data amount of the LF data.

Furthermore, explanation was given for operation in the above described image capturing apparatus having the image sensor 107 in the present embodiment, but there is no limitation to this. For example, the present invention may be applied to a focus detection apparatus that has the image sensor 107 and performs the above described focus detection operation. In addition, the present invention is also applicable to a case in which an image processing apparatus that is not provided with the image sensor 107 separately obtains the plurality of parallax signals output from the image sensor 107—in other words obtains the subpixel signals in for example a RAW format file or the like—and thereby generates the above described parallax images. Furthermore, the image sensor 107 may perform the above described processing for generating parallax images and output the parallax images.

Second Embodiment

Next, explanation will be given for a second embodiment. In the first embodiment, configuration is such that each pixel is arranged so that the photoelectric conversion region of the respective pixel is divided along horizontal and vertical directions, but in the second embodiment, two types of pixels are arranged where the photoelectric conversion regions of the respective pixels are divided along different diagonal directions that are directions that intersect each other. In the present embodiment, one photoelectric conversion region corresponds to one subpixel whereas two photoelectric conversion regions construct one subpixel. For this reason, the configuration of each pixel of the image sensor 107 according to the present embodiment is different to in the first embodiment, but other configurations and processing are the same as in the first embodiment. For these reasons, the same reference numerals are given to the same elements; overlapping explanation is omitted, and predominantly explanation is given for differences.

Figure 8:
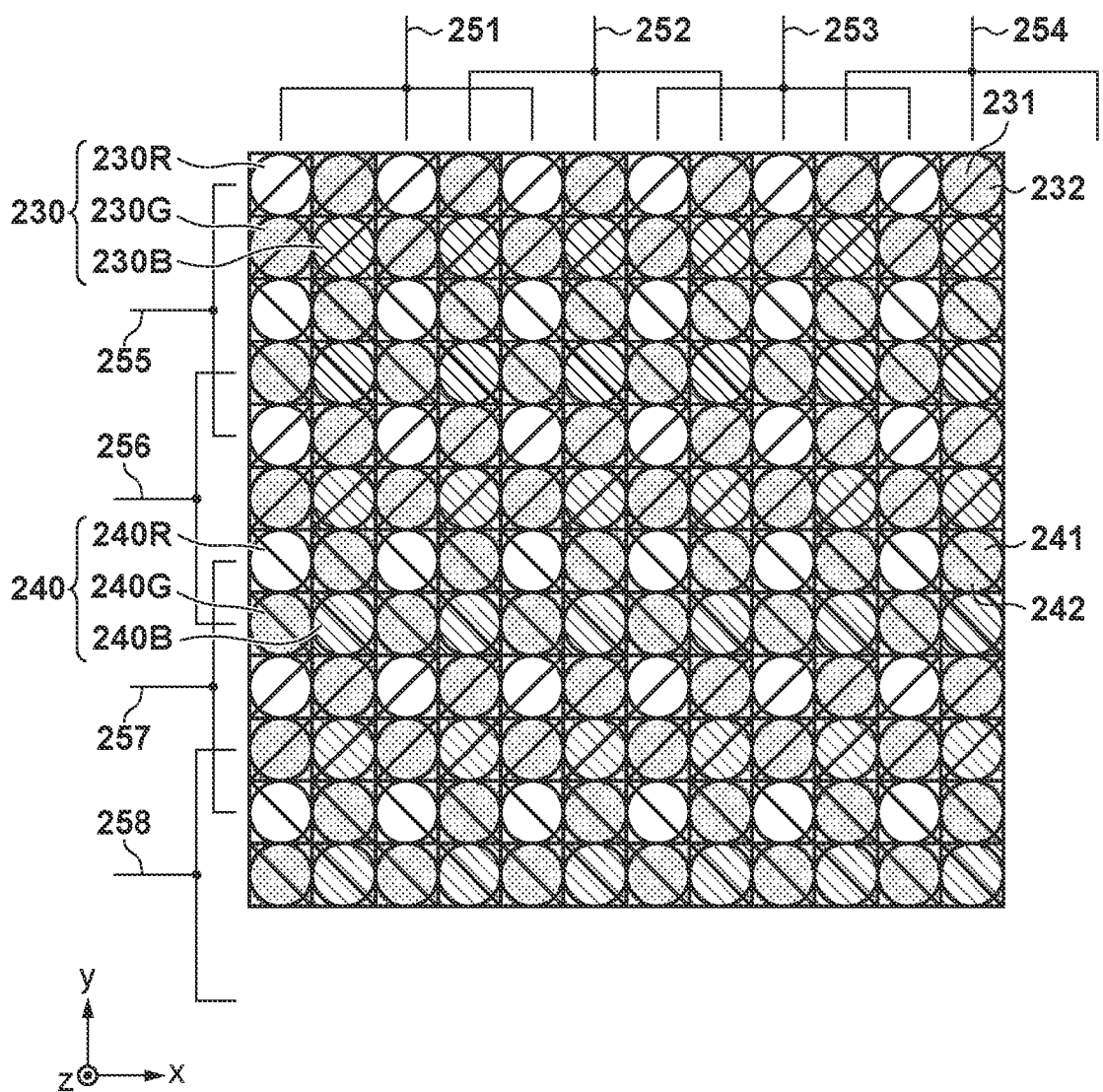
FIG. 8 is a view for illustrating schematically a pixel array according to a second embodiment.

Next, with reference to FIG. 8, explanation is given of an array of subpixels and pixels of an image sensor as an example according to the present embodiment. FIG. 8, similarly to FIG. 2, shows an array of pixels arranged two-dimensionally, with a range of 12 columns×12 rows.

Pixel groups according to the present embodiment, similarly to the pixel groups explained in the first embodiment, are configured as units of four pixels arranged in two columns×two rows, and configured by pixels having a spectral sensitivity of one of the colors of RGB. For example, in a pixel group 230, a pixel 230R having spectral sensitivity for R (red), pixels 230G having spectral sensitivity for G (green), and a pixel 230B having spectral sensitivity for B (blue) are respectively arranged. However, in the present embodiment, each pixel (referred to as a third pixel) that configures the pixel group 230 has a subpixel 231 and a subpixel 232 that are divided into a top-left and a bottom-right.

In addition, a pixel group 240 that is comprised by pixels of two columns×two rows has pixels for each of RGB arranged similarly to the pixel group 230. Each pixel (referred to as a fourth pixel) that configures the pixel group 240 has a subpixel 241 and a subpixel 242 that are divided into a top-right and a bottom-left. In other words, a division state of subpixels corresponding to fourth pixels differs from a division state of subpixels corresponding to third pixels in that the directions of division are different and are configured to be in a relation that intersect or are orthogonal.

Next, explanation is given with reference to FIG. 9A, FIG. 9B, FIG. 10A, and FIG. 10B regarding an internal structure of the image sensor 107 according to the present embodiment.

Figure 9A:
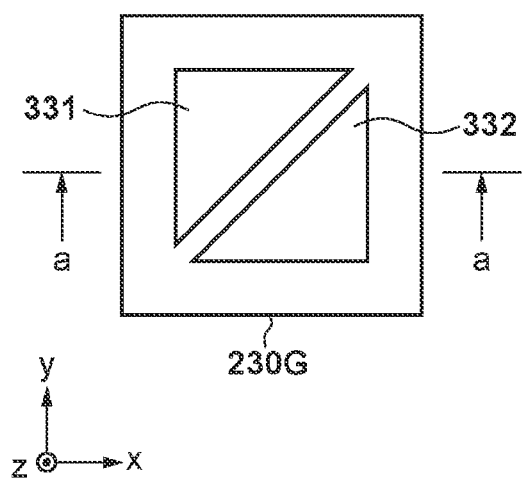
FIGS. 9A and 9B are respectively a plan view and a cross-sectional view that schematically show the first pixel according to the second embodiment.
Figure 9B:
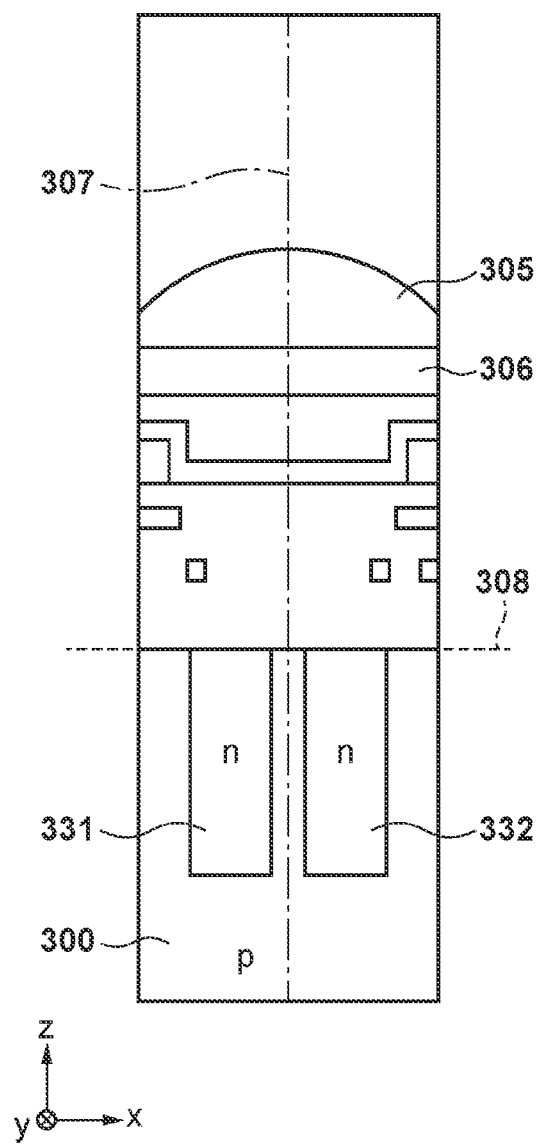

As an example of a third pixel that comprises the image sensor 107, the pixel 230G is shown on FIG. 9A in a plan view from the perspective of a light-receiving surface side (+z side) of the image sensor 107 and shown on FIG. 9B as a cross-sectional view of an a-a cross-section of FIG. 9A from the perspective of a -y side.

In the third pixel (for example, the pixel 230G) a photoelectric conversion unit 331 and a photoelectric conversion unit 332 that are divided into a top-left and a bottom-right are formed. The photoelectric conversion unit 331 and the photoelectric conversion unit 332 respectively correspond to the subpixel 231 and the subpixel 232.

Similarly, FIG. 10A and FIG. 10B show a plan view and a cross-sectional view of a fourth pixel (for example, a pixel 240G), and a photoelectric conversion unit 341 and a photoelectric conversion unit 342 that are divided into atop-right and a bottom-left are formed in the fourth pixel. The photoelectric conversion unit 341 and the photoelectric conversion unit 342 respectively correspond to the subpixel 241 and the subpixel 242.

Figure 11:
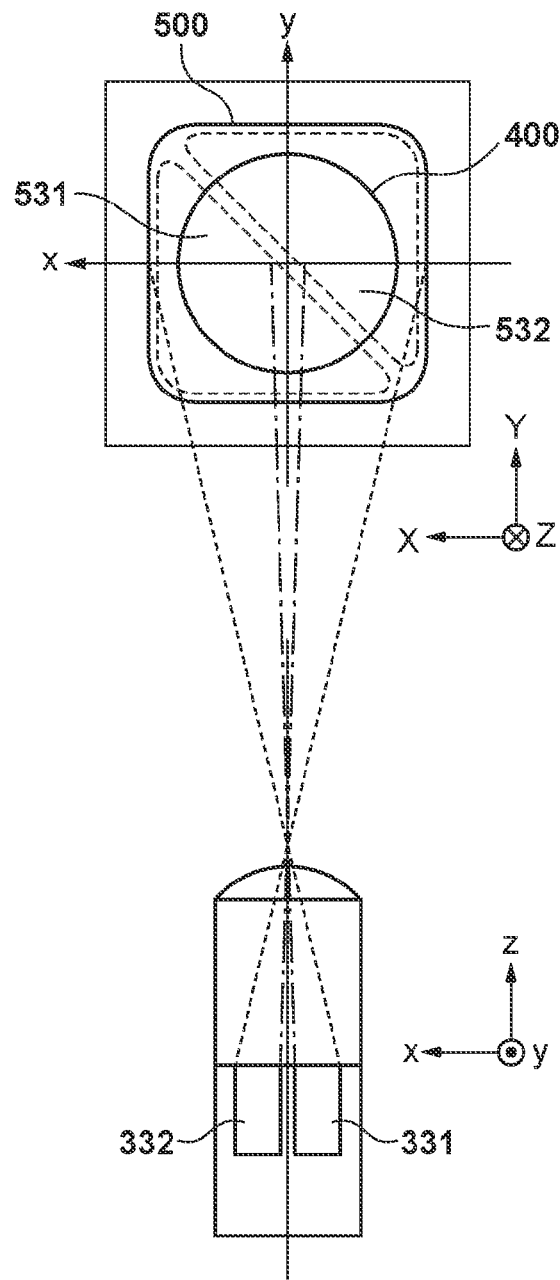
FIG. 11 is a view explaining a relation between pupil division and the first pixel according to the second embodiment.

Furthermore, explanation is given with reference to FIG. 11A and FIG. 11B of correspondence between pupil division and the structure of the third pixel according to the present embodiment. FIG. 11 shows an exit pupil surface (a top side) of an imaging optical system in accordance with a form similar to that of FIG. 4, and a cross-sectional view (a bottom side) of an a-a cross-section of the third pixel shown in FIG. 9A from the perspective of a +y side.

A pupil sub-region 531 of the subpixel 231 represents a pupil region capable of receiving light in the subpixel 231. The pupil sub-region 531 of the subpixel 231 is mainly conjugate with a light-receiving surface of the photoelectric conversion unit 331, whose centroid is decentered in a (-x, +y) direction by the microlens 305. The centroid of the pupil sub-region 531 of the subpixel 231 is decentered in a (+x, -y) side on the pupil plane.

The pupil sub-region 532 of the subpixel 232 is mainly conjugate with a light-receiving surface of the photoelectric conversion unit 332, whose centroid is decentered in a (+x, -y) direction by the microlens, and represents a pupil region that can receive light in the second subpixel 232. The centroid of the pupil sub-region 532 of the subpixel 232 is decentered in a (-x, +y) side on the pupil plane. Note that the pupil region 500 is a pupil region capable of receiving light in the pixel 230G overall when the photoelectric conversion unit 331 and the photoelectric conversion unit 332 (the first subpixel 231 and the second subpixel 232) are wholly combined.

Figure 12:
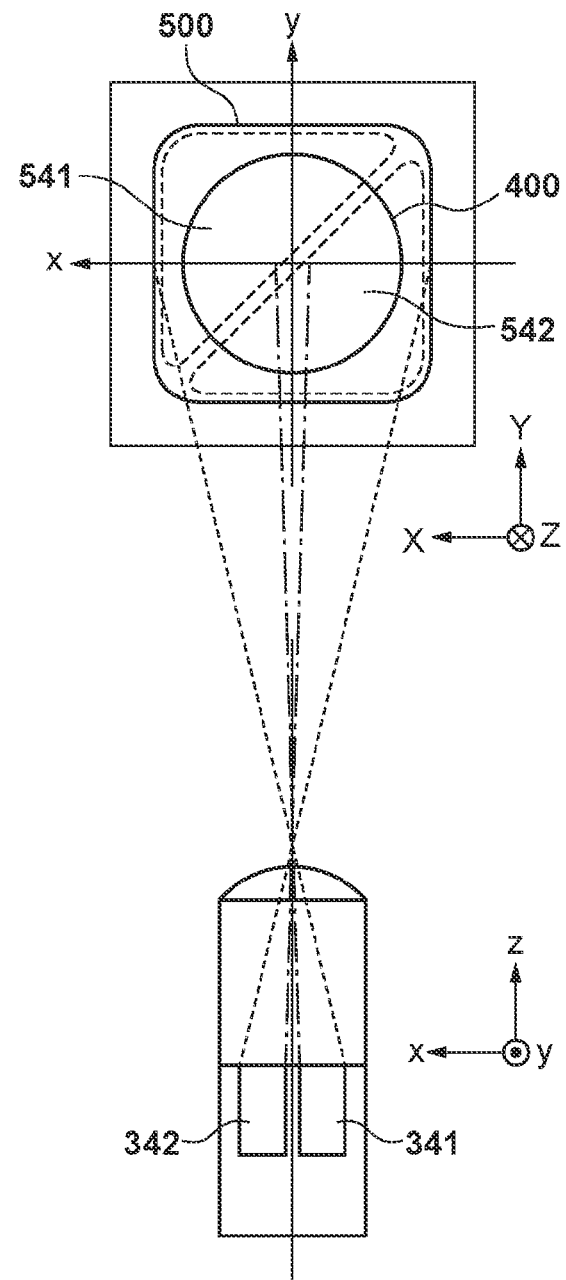
FIG. 12 is a view explaining a relation between pupil division and the second pixel according to the second embodiment.

Furthermore, in FIG. 12, a correspondence relationship between the pupil division and the structure of the pixel shown in FIG. 10A and FIG. 10B is shown. A pupil sub-region 541 of the subpixel 241 is mainly conjugate with a light-receiving surface of the photoelectric conversion unit 341, whose centroid is decentered in a (-x, -y) direction by the microlens, and represents a pupil region capable of receiving light in the subpixel 241. The centroid of the pupil sub-region 541 of the subpixel 241 is decentered in a (+x, +y) side on the pupil plane.

A pupil sub-region 542 of the subpixel 242 is mainly conjugate with a light-receiving surface of the photoelectric conversion unit 342, whose centroid is decentered in a (+x, +y) direction by the microlens, and represents a pupil region that can receive light in the subpixel 242. The centroid of the pupil sub-region 542 of the subpixel 242 is decentered in a (-x, -y) side on the pupil plane.

In this way, the image sensor 107 according to the present embodiment receives a light beam that passes through different pupil sub-regions by the subpixels 331 and 332, which are divided in a rightward diagonally upward direction, of the third pixel, and the subpixel 341 and the subpixel 342, which are divided in a rightward diagonally downward direction, of the fourth pixel. With such a configuration the image sensor 107 can output parallax signals having rightward diagonally downward parallax and parallax signals having rightward diagonally upward parallax. In other words, in the present embodiment, it is possible to obtain four parallax signals while limiting the total number of signal reads for the photoelectric conversion unit with respect to each the microlens to two. Additionally, similarly to in the first embodiment, by adding the signals of the two subpixels for each pixel (for example the subpixel 231 and the subpixel 232), it is possible to generate the image signal at a resolution with the number of effective pixels N.

In addition, in processing for generating parallax images according to the present embodiment, parallax images having four different viewpoints may be generated by making the subpixel signal HA(j1, i) and the subpixel signal HB(j1, i) correspond to the subpixel 231 and the subpixel 232, and the subpixel signal VA(j2, i) and the subpixel signal VB(j2, i) correspond to the subpixel 241 and the subpixel 242. If such a configuration is taken, it is possible to generate parallax images having four viewpoints—up, down, left and right.

Note that in the present embodiment, explanation was given for of an example of generating four parallax images by divided the photoelectric conversion region of each pixel in two by different methods. However, the number of divisions of the photoelectric conversion region of each pixel is not limited to this, and it is possible to apply the present invention to another number of divisions. For example, configuration may be made to arrange two types of pixel that are divided into three in a horizontal direction or a vertical direction, or to arrange two types of pixel that are divided into four by different division methods. By configuring in this way, it is possible to obtain parallax signals for more viewpoints while suppressing the number of divisions of the photoelectric conversion regions of single pixels.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-244382, filed Dec. 2, 2014, and No. 2015-182231, filed Sep. 15, 2015, which are hereby incorporated by reference herein in their entirety.

What is claimed is:

1. An image sensor in which pixels, each having a photoelectric conversion region divided into a plurality of regions, are arranged two-dimensionally, the image sensor comprising:
   a first pixel, from the pixels, for which each of photoelectric conversion regions divided in a first direction receives a light beam that passes through a pupil region of an imaging optical system that corresponds to each of photoelectric conversion regions;
   a second pixel, from the pixels, for which each of photoelectric conversion regions divided in a second direction different to the first direction receives a light beam that passes through the pupil region of the imaging optical system that corresponds to each of photoelectric conversion regions,
   wherein the first pixel outputs signals having parallax in the first direction from the photoelectric conversion regions divided in the first direction, and
   the second pixel outputs signals having parallax in the second direction from the photoelectric conversion regions divided in the second direction; and
   an image processing circuit configured to generate, based on a first signal output from the first pixel and a second signal output from the second pixel, parallax images having a number of parallaxes that is more than a number of parallaxes included in each of the first signal and the second signal.

2. The image sensor according to claim 1, wherein the first direction and the second direction are directions orthogonal to each other.

3. The image sensor according to claim 1, wherein the first direction divides the photoelectric conversion region in a horizontal direction, and the second direction divides the photoelectric conversion region in a vertical direction.

4. The image sensor according to claim 1, wherein the first pixel and the second pixel are respectively arranged adjacently in a unit of a row or a column, and the first pixel and the second pixel are alternatingly arranged in a unit of a predetermined number of pixels in a direction perpendicular to the arranged adjacently direction.

5. The image sensor according to claim 4, wherein said image processing circuit is configured to sample the adjacently arranged first pixel or second pixel at a predetermined first period in the adjacently arranged direction, and to sample at a predetermined second period pixels divided by the same method in the direction perpendicular to the arranged adjacently direction.

6. The image sensor according to claim 1, further comprising a microlens corresponding to each of the first pixel and the second pixel.

7. The image sensor according to claim 1, wherein the pixels have photoelectric conversion regions divided in the first direction and the second direction, and at least one of the divided photoelectric conversion regions is used to configure the first pixel or the second pixel.

8. An image capturing apparatus comprising:
an image sensor in which pixels, each having a photoelectric conversion region divided into a plurality of regions, are arranged two-dimensionally,
wherein the image sensor comprises:
a first pixel, from the pixels, for which each of photoelectric conversion regions divided in a first direction receives a light beam that passes through a pupil region of an imaging optical system that corresponds to each of photoelectric conversion regions;
a second pixel, from the pixels, for which each of photoelectric conversion regions divided in a second direction different to the first direction receives a light beam that passes through the pupil region of the imaging optical system that corresponds to each of photoelectric conversion regions, and
an image processing circuit configured to generate, based on a first signal output from the first pixel and a second signal output from the second pixel, parallax images having a number of parallaxes that is more than a number of parallaxes included in each of the first signal and the second signal,
wherein the first pixel outputs signals having parallax in the first direction from the photoelectric conversion regions divided in the first direction, and
wherein the second pixel outputs signals having parallax in the second direction from the photoelectric conversion regions divided in the second direction.

9. A focus detection apparatus comprising:
an image sensor in which pixels, each having a photoelectric conversion region divided into a plurality of regions, are arranged two-dimensionally, the image sensor comprising
a first pixel, from the pixels, for which each of photoelectric conversion regions divided in a first direction receives a light beam that passes through a pupil region of an imaging optical system that corresponds to each of photoelectric conversion regions, and
a second pixel, from the pixels, for which each of photoelectric conversion regions divided in a second direction different to the first direction receives a light beam that passes through the pupil region of the imaging optical system that corresponds to each of photoelectric conversion regions, wherein
the first pixel outputs signals having parallax in the first direction from the photoelectric conversion regions divided in the first direction, and
the second pixel outputs signals having parallax in the second direction from the photoelectric conversion regions divided in the second direction; and
an image processing circuit configured to:
obtain a signal output from the image sensor that includes a first signal output from the first pixel and a second signal output from the second pixel,
calculate a defocus amount that represents a distance between an image forming position and an image capturing surface based on at least one of the first signal and the second signal;
perform focus detection based on the calculated defocus amount, and
generate, based on a first signal output from the first pixel and a second signal output from the second pixel, parallax images having a number of parallaxes that is more than a number of parallaxes included in each of the first signal and the second signal.

10. An image processing apparatus comprising:
an image processing circuit configured to obtain a signal output from an image sensor in which pixels, each having a photoelectric conversion region divided into a plurality of regions, are arranged two-dimensionally, the image sensor comprising
a first pixel, from the pixels, for which each of photoelectric conversion regions divided in a first direction receives a light beam that passes through a pupil region of an imaging optical system that corresponds to each of photoelectric conversion regions, and
a second pixel, from the pixels, for which each of photoelectric conversion regions divided in a second direction different to the first direction receives a light beam that passes through the pupil region of the imaging optical system that corresponds to each of photoelectric conversion regions,
wherein the first pixel outputs signals having parallax in the first direction from the photoelectric conversion regions divided in the first direction, and
the second pixel outputs signals having parallax in the second direction from the photoelectric conversion regions divided in the second direction, and
wherein the signal output from the image sensor includes a first signal output from the first pixel and a second signal output from the second pixel; and
wherein said image processing circuit is further configured to generate, based on the first signal and the second signal, parallax images having a number of parallaxes that is more than a number of parallaxes obtained by dividing the photoelectric conversion region.

11. A control method of an image processing apparatus having:
an image sensor in which pixels, each having a photoelectric conversion region divided into a plurality of regions, are arranged two-dimensionally, the image sensor comprising
a first pixel, from the pixels, for which each of photoelectric conversion regions divided in a first direction receives a light beam that passes through a pupil region of an imaging optical system that corresponds to each of photoelectric conversion regions, and
a second pixel, from the pixels, for which each of photoelectric conversion regions divided in a second direction different to the first direction receives a light beam that passes through the pupil region of the imaging optical system that corresponds to each of photoelectric conversion regions, the method comprising:
obtaining a signal output from the image sensor, in which the first pixel outputs signals having parallax in the first direction from the photoelectric conversion regions divided in the first direction, and
the second pixel outputs signals having parallax in the second direction from the photoelectric conversion regions divided in the second direction, that includes a first signal output from the first pixel and a second signal output from the second pixel; and
generating, based on the first signal and the second signal, parallax images having a number of parallaxes that is more than a number of parallaxes included in each of the first signal and the second signal.

12. The image sensor according to claim 1, further comprising a plurality of the first pixel and a plurality of the second pixel, wherein the image processing circuit generates, using a signal output from the pixels, one of a signal corresponding to the first pixel in signals configuring the parallax images.

13. The image sensor according to claim 12, wherein the image processing circuit generates the one of the signal corresponding to the first pixel by using the signal output from the first pixel and signals output from the plurality of the second pixel.

14. The image sensor according to claim 12, wherein the image processing circuit generates the one of the signal corresponding to the first pixel by using a signal averaging the signal output from the first pixel and signals output from the plurality of the second pixel.

* * * * *